United States Patent
Boudreau et al.

(10) Patent No.: US 10,502,771 B2
(45) Date of Patent: Dec. 10, 2019

(54) DETECTING CURRENT MEASUREMENT TAMPERING BY CURRENT TRANSFORMER PARALLEL IMPEDANCE

(71) Applicant: Landis+Gyr LLC, Lafayette, IN (US)

(72) Inventors: Frank J. Boudreau, Otterbein, IN (US); Matthew E. Kraus, Jamestown, IN (US); Detlef Griessman, West Lafayette, IN (US)

(73) Assignee: Landis+Gyr LLC, Lafayette, IN (US)

(*) Notice: Subject to any disclaimer, the term of this patent is extended or adjusted under 35 U.S.C. 154(b) by 382 days.

(21) Appl. No.: 15/420,078

(22) Filed: Jan. 30, 2017

(65) Prior Publication Data

US 2017/0219639 A1    Aug. 3, 2017

Related U.S. Application Data

(60) Provisional application No. 62/288,901, filed on Jan. 29, 2016.

(51) Int. Cl.
  *G01R 22/06* (2006.01)
  *G01R 15/14* (2006.01)
  *G01R 35/00* (2006.01)

(52) U.S. Cl.
  CPC ......... *G01R 22/066* (2013.01); *G01R 15/146* (2013.01); *G01R 35/00* (2013.01)

(58) Field of Classification Search
  CPC .... G01R 15/146; G01R 15/18; G01R 15/183; G01R 15/185; G01R 19/0092; G01R 19/2513; G01R 22/066; G01R 22/0092; G01R 27/16; G01R 30/025; G01R 35/00
  USPC ............................ 324/110, 127, 691, 750.02
  See application file for complete search history.

(56) References Cited

U.S. PATENT DOCUMENTS

| | | | | |
|---|---|---|---|---|
| 4,337,466 A | * | 6/1982 | Spahn | H04M 11/002 340/512 |
| 4,532,471 A | * | 7/1985 | Hurley | G01R 22/066 324/110 |
| 4,758,774 A | * | 7/1988 | Crawford | G01R 29/20 324/140 D |
| 7,944,199 B2 | * | 5/2011 | Wynne | G01R 19/0084 324/126 |
| 8,564,269 B2 | * | 10/2013 | Mohr | G01R 19/0092 323/222 |
| 2002/0180444 A1 | * | 12/2002 | Bauer | H02H 3/335 324/424 |

(Continued)

*Primary Examiner* — Steven L Yeninas
(74) *Attorney, Agent, or Firm* — Kilpatrick Townsend & Stockton LLP (57) ABSTRACT

A method detects an error in a meter having a current transformer, a burden resistor unit and a resistive path switchably connectable across the burden resistor unit. The method includes obtaining in the processing circuit a first value representative of the voltage magnitude across the burden resistor unit while the resistive path is operably decoupled across the burden resistor unit. The method also includes closing a switching element to operably couple the resistive path across the burden resistor unit, and obtaining in a processing circuit a second value representative of a voltage magnitude across the burden resistor unit. The method further includes determining in the processing circuit whether an error exists based on the first value, the second value, and at least one predetermined stored value.

19 Claims, 5 Drawing Sheets

(56) References Cited

U.S. PATENT DOCUMENTS

| | | | | |
|---|---|---|---|---|
| 2005/0162788 A1* | 7/2005 | Boudaud | ......... | H02H 3/006 |
| | | | | 361/42 |
| 2005/0195550 A1* | 9/2005 | Fitzgerald | ......... | H01H 9/542 |
| | | | | 361/139 |
| 2006/0241881 A1* | 10/2006 | Gasperi | ......... | G01R 27/16 |
| | | | | 702/62 |
| 2012/0139555 A1* | 6/2012 | Mayfield | ......... | G01R 1/203 |
| | | | | 324/547 |
| 2014/0354266 A1* | 12/2014 | Hurwitz | ......... | G01R 19/0092 |
| | | | | 324/140 R |
| 2015/0194798 A1* | 7/2015 | Ward | ......... | H01H 83/00 |
| | | | | 361/47 |
| 2018/0131173 A1* | 5/2018 | Iwami | ......... | H02H 3/16 |

* cited by examiner

DETECTING CURRENT MEASUREMENT TAMPERING BY CURRENT TRANSFORMER PARALLEL IMPEDANCE

This application claims the benefit of U.S. Provisional Patent Application Ser. No. 62/288,901, filed Jan. 29, 2016.

FIELD OF THE INVENTION

The present invention relates generally to electricity meters, and more specifically, to tamper detection in electricity meters.

BACKGROUND

Electricity meters are typically employed for, among other things, measuring electricity consumption for the purpose of billing customers for energy usage. Tampering with a meter to hamper its ability to accurately measure consumption results in energy theft. Accordingly, it is necessary to employ methods of detecting and/or inhibiting tampering. Tampering can take many forms. One method of tampering consists of tampering with the measurement ability of the current transformer (CT). CTs are used in many meters to measure current flow to, and hence energy usage by, a customer load.

Figure 1:
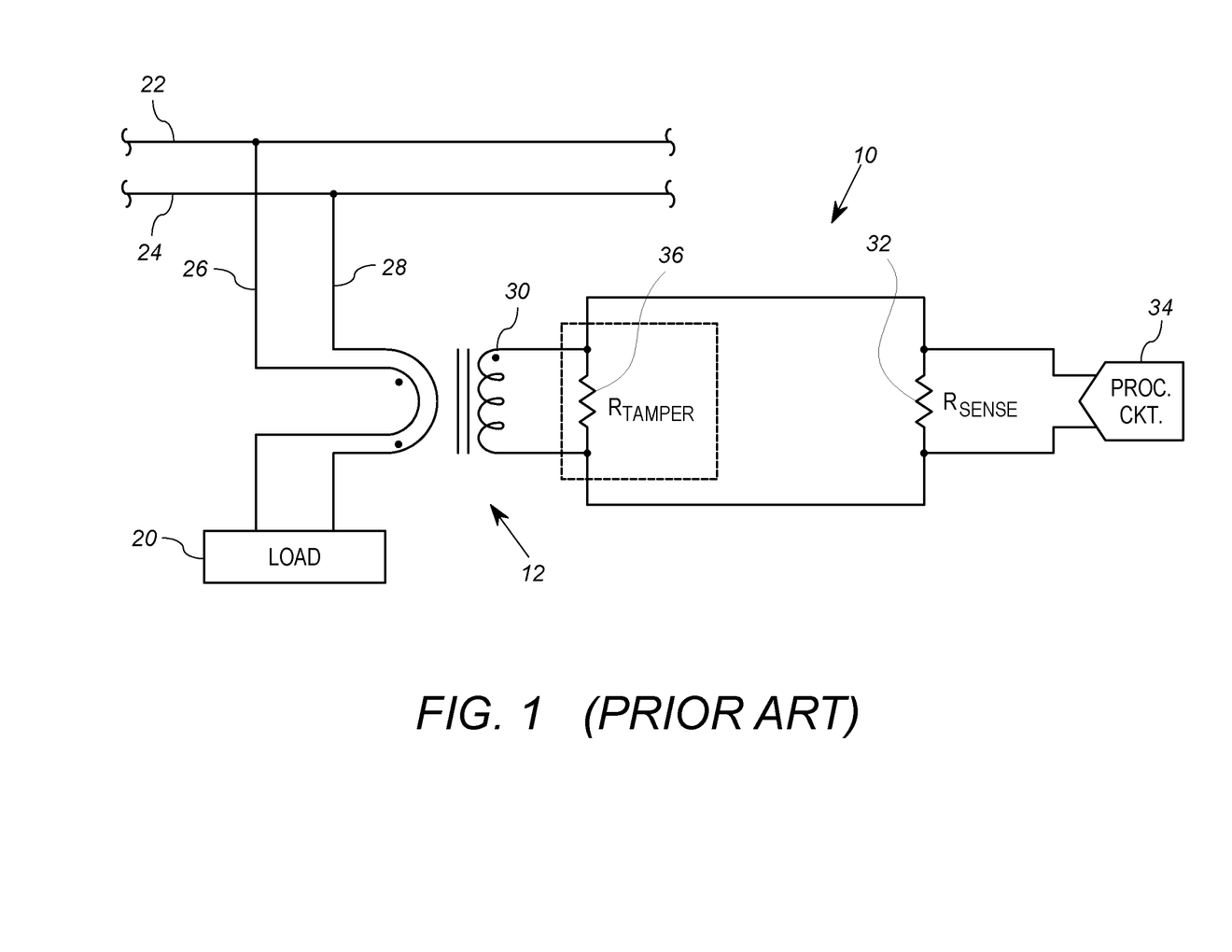

FIG. 1 shows a schematic diagram relevant portion of a prior art electricity meter 10 connected to the electrical service of a load 20, wherein the CT 12 of the meter 10 that has been tampered with using a resistor 36. In general, the load 20 is connected to the power lines 22, 24 via respective service lines 26, 28. The service lines 26, 28 collectively carry the current provided to the load 20. To measure energy consumption, the meter 10 measures voltage and current signals on the service lines 26, 28. The meter 10 measures the current consumption using the CT 12, which detects the current flowing through the service lines 26, 28 on its secondary winding 30. The secondary winding 30 carries a measurement current signal that is proportional to the current signal on the service lines 26, 28. Ideally, the burden resistor 32 receives the entire measurement current signal from the secondary winding 30. The processing circuit 34 receives the voltage drop over the burden resistor 32, which ideally represents the current signal in the secondary winding 30 and hence the current in the service lines 26, 28.

In the tampered meter 10 of FIG. 1, however, the burden resistor 32 does not receive all of the measurement current from the secondary winding 30 of the CT 12. The meter 10 has been subject to tampering by placement of a resistor 36 across the secondary winding 30. The resistor 36 consumes some of the current from the secondary winding 30, thereby reducing the amount of current dropped over the burden resistor 32. As a consequence, the processing circuit 34 receives a signal that has a smaller magnitude than the measurement current flowing through the secondary winding 30.

The present method used by the utility to detect this type of tampering is comparing month-to-month consumption to look for anomalous behavior or trends. This method can be subjective and inaccurate, however, and often results in misdiagnosis of tampering. Another method is to perform a visual check when a meter is inspected at the installation site. However, visual inspection will not always result in detection of a resistor such as the resistor 36 of FIG. 1.

Accordingly, there is a need for a method and/or apparatus for detecting tampering with a current measurement in an electricity meter.

SUMMARY

At least some embodiments of the present invention address the above-stated needs, as well as others, by providing a known impedance with a controllable switch placed in parallel with the winding of the CT. The known impedance provides a known transfer function that will expose any additional shunt resistor placed over the coils of the CT.

A first embodiment is a method that detects an error in a meter having a current transformer, a burden resistor unit and a resistive path switchably connectable across the burden resistor unit. The method includes obtaining in the processing circuit a first value representative of the voltage magnitude across the burden resistor unit while the resistive path is operably decoupled across the burden resistor unit. The method also includes closing a switching element to operably couple the resistive path across the burden resistor unit, and obtaining in a processing circuit a second value representative of a voltage magnitude across the burden resistor unit. The method further includes determining in the processing circuit whether an error exists based on the first value, the second value, and at least one predetermined stored value.

A second embodiment is an arrangement for use in a utility meter that includes a current transformer, a burden resistor unit, a resistive path, a switch and a processing circuit. The current transformer has a winding including first and second terminals. The burden resistor unit is coupled across the first and second terminals. The switch is operably coupled to controllably and alternatively connect and disconnect the resistive path across the first and second terminals. The processing circuit is configured to obtain a first value representative of a voltage magnitude across the burden resistor unit when the resistive path is disconnected across the first and second terminals, and to obtain a second value representative of the voltage magnitude across the burden resistor unit when the resistive path is connected across the first and second terminals. The processing circuit is further configured to determine whether an error exists based on the first value, the second value, and at least one predetermined stored value.

The above described features and advantages, as well as others, will become more readily apparent to those of ordinary skill in the art by reference to the following detailed description and accompanying drawings.

BRIEF DESCRIPTION OF THE DRAWINGS

FIG. 1 shows a schematic diagram relevant portion of a prior art electricity meter that has been tampered with;

DETAILED DESCRIPTION

Figure 2:
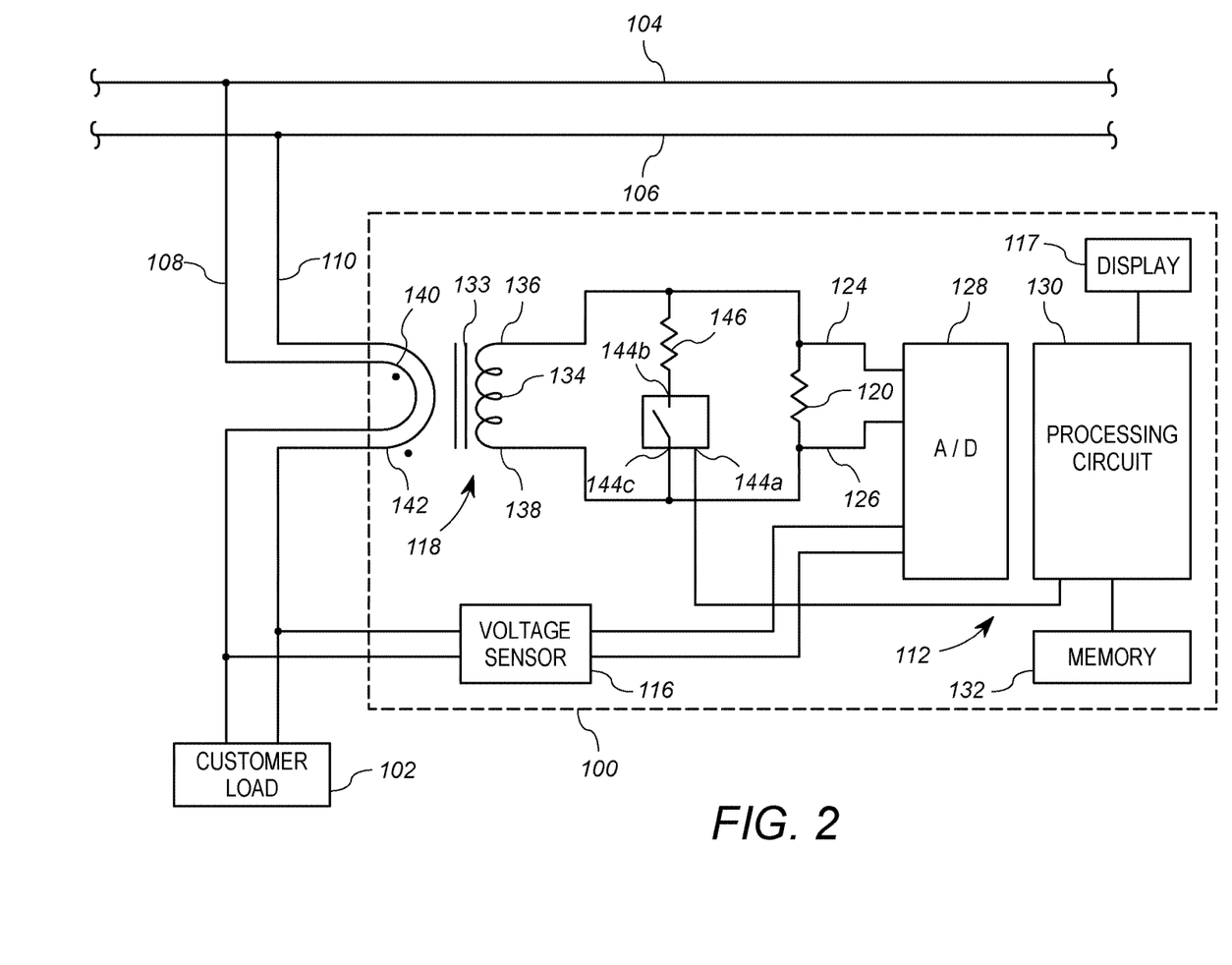
FIG. 2 shows a schematic diagram of an exemplary meter that incorporates a first embodiment of the invention.

FIG. 2 shows a schematic diagram of an exemplary meter 100 that incorporates a first embodiment of an arrangement 101 for detecting current measurement anomalies, such as those due to metering tampering. The meter 100 is generally configured to measure and meter the energy delivered to a customer load 102 from power lines 104, 106 via respective service lines 108, 110. In this embodiment the power lines 104, 106 carry a 60 Hz AC voltage of 240 volts RMS.

The meter 100 includes a processing circuit 112, a current sensor circuit 114, a voltage sensor circuit 116, a display 117 and current coils 140, 142. The current sensor circuit 114 includes a current transformer 118, a burden resistor unit 120, a switchable resistive path 122, and output terminals 124, 126. The current coils 140, 142 connect, respectively, the service lines 108, 110 to the load 102, and thus carry the voltage signal and current signal provided to the load 102. The voltage sensor circuit 116 is any suitable circuit for generating a voltage measurement signal, such as a voltage divider. The voltage sensor circuit 116 is operably coupled to the current coils 140, 142 to detect the voltage signal provided to the load 102. The processing circuit 112 includes an analog-to-digital conversion (ADC) unit 128, a digital processing circuit 130 and at least one memory 132.

With specific reference to the current sensor circuit 114, the current transformer 118 includes a winding 134 having a first terminal 136 and a second terminal 138. The current transformer 118 is operably coupled in a known manner to detect current flowing through the service lines 108, 110. In this embodiment, the current transformer 118 is in the form of a toroid and includes a core 133 around which the winding 134 is wound. To allow the current transformer 118 to detect current, the current coils 140, 142 of the meter 100 pass through the interior opening of the toroid current transformer 118. Thus, even though the current coils 140, 142 are not physically part of the current transformer device 118, the current coils 140, 142 form first and second "primary" windings of the transformer circuit of the current transformer 118. The winding 134 forms the secondary winding. In general, the current transformer 118 operates to generate a current waveform that constitutes a scaled down version of the combined current waveforms on the current coils 140, 142 (and hence the current delivered to the load).

The burden resistor unit 120 is one or more resistors coupled across the output terminals 124, 126 of the current sensor unit 114. Typically, the burden resistor unit 120 may suitably be a single resistor. However, any suitable series and/or parallel combination of resistors or resistive devices can be used. The resistance of the burdent resistor unit 120 is typically on the order of 1 or 2 ohms. The burden resistor unit 120 is in any event configured to generate a current measurement signal Vout across the terminals 124, 126. The current measurement signal Vout has a voltage waveform that corresponds to the current waveform generated by the current transformer 118 on the winding 134.

The display 117 is any suitable meter display, such as an LCD display or the like. The display 117 is operably coupled to the digital processing circuit 130 to receive information for display therefrom. The digital processing circuit 130 may, for example, cause display of values related to energy consumption as measured by the meter 100.

The ADC unit 128 is any suitable circuit for generating sampled digital values representative of the current measurement signal Vout received from the current sensor 114 and generating sampled digital values representative of the voltage measurement signal received from the voltage sensor 116. The ADC unit 128 is operably coupled to provide the digital current measurement signals and the digital voltage measurement signals to the digital processing circuit 130.

The switchable resistive path 122 is a circuit path, having one or more circuit elements, coupled across the output terminals 124, 126 The switchable resistive path 122 has a resistance value that may be operably and switchably coupled across and decoupled across the terminals 124, 126. To this end, the switchable resistive path 122 in this embodiment includes a switching element 144 and a resistor 146. The switching element 144 has an open (non-conducting) state and a closed (conducting) state. The switching element 144 includes a control terminal 144a, a first output terminal 144b, and a second output terminal 144c. The first output terminal 144b is coupled to the output terminal 124 via the resistor 146, and the secoud output terminal 144c is coupled to the output terminal 126.

The state of the switching element 144 is controlled by the voltage or signal present on its control terminal 144a, which is preferably received from the digital processing circuit 130. In the open state, the switching element 144 does not conduct current between its output terminals 144b, 144c, and thus the resistor 146 is open-circuited. In the closed state, the switching element 144 conducts current between its output terminals 144b, 144c, and thus the resistor 146 is coupled across the terminals 124, 126. Accordingly, the switchable resistive path 122 essentially constitutes a parallel resistive path to the burden resistor 120 that may be controllably disconnected.

Figure 5:
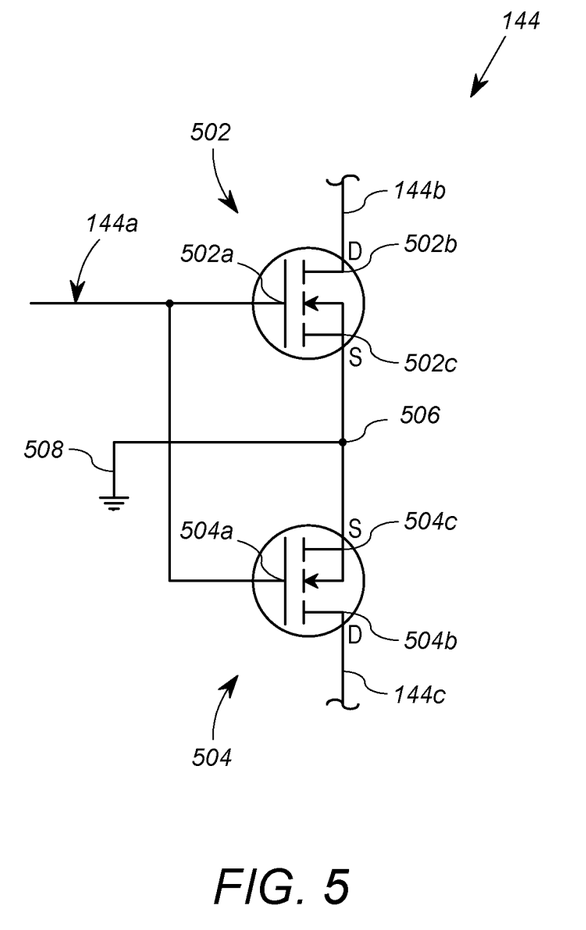
FIG. 5 shows a schematic diagram of an exemplary switching element of the meter of FIG. 2.

FIG. 5 shows an exemplary embodiment of the switching element 144. In this embodiment the the switching element 144 includes two series-connected transistors in the form of a first MOSFET 502 and a second MOSFET 504. The first MOSFET 502 includes a gate 502a, a drain 502b and a source 502c, and second MOSFET 504 includes a gate 504a, a drain 504b and a source 504c. The control terminal 144a is coupled to the gates 502a and 504a of the MOSFETS 502, 504. The first output terminal 144b is (or is connected to) the drain 502b of the first MOSFET 502, and the second output terminal 144c is (or is connected to) the drain 504b of the second MOSFET 504. The sources 502c and 504c of the MOSFETs 502, 504 are coupled to each other at a node 506. The node 506 is connected to a suitable reference voltage 508, to which the control signal on the control terminal 144a may be referenced to switch on the MOSFETs 502, 504. The reference voltage 508 may suitably be the voltage on the second terminal 138 of the CT 118.

In operation, applying a voltage to the control terminal 144a that exceeds the reference voltage 508 by an amount equal to or greater than the turn-on voltage of the MOSFETs 502, 504, the MOSFETs 502, 504 will turn on and the switching element 144 will conduct from the first output terminal 144b to the second output terminal 144c. When no such voltage is applied, the MOSFETs 502, 504 will not turn on and current does not flow between the first output terminal 144b and the second output terminal 144c. It will be appreciated that the switching element 144 may take other forms. However, the embodiment of FIG. 5 is particularly well-suited because it employs only two MOSFETs.

Referring again to FIG. 2, the digital processing circuit 130 may suitably be a microcontroller, microprocessor, digital signal processor, or any combination thereof that is configured (e.g. via software programming) to generate energy consumption measurements (e.g. kilowatt-hr, ampere-hr, VAR-hr, $I_{RMS}$, and/or $V_{RMS}$) from the digital current and voltage measurement signals received from the ADC unit 128. The digital processing circuit 130 is further configured to cause the display 117 to display information representative of or derived from at least some of the energy consumption measurements. In addition, the digital processing circuit 130 is configured to carry out the functional operations ascribed to it herein, particularly those relating to determining whether a current measurement error exists in the meter 100. It will be appreciated that the digital processing circuit 130 is configured to carry out the functional operations described herein at least in part by executing programming instructions stored in the memory 132, which may suitably be or include memory formed in the same chip package as the digital processing circuit 130.

To detect measurement errors as discussed herein, the digital processing circuit 130 is configured to obtain, via the ADC unit 128, a first value representative of a voltage magnitude across the burden resistor unit 120 when the resistive path 122 is connected across the first and second output terminals 124, 126, and obtain a second value representative of the voltage magnitude across the burden resistor unit 120 when the resistive path 122 is disconnected across the first and second output terminals 120. The digital processing circuit 130 is further configured to determine whether an error exists based on the first value, the second value, and at least one predetermined stored value.

To this end, the burden resistor unit 120 provides an voltage signal Vout at the output terminals 124, 126 that is representative of the current signal on the secondary winding of the CT. The voltage signal Vout, therefore, is ideally representative of the current consumed by the customer load. Thus, the voltage signal Vout provided to the ADC unit 128 is an analog current measurement signal that is representative of the current signal provided to the customer load 102.

The signal level of Vout will vary based on whether othe switch 144 is conducting (on) or non-conducting (off). The following known transfer functions yield the signal level of Vout when the switch 144 is turned on ($Vout_{on}$) and off ($Vout_{off}$).

$$Vout_{off} = R_{sense} * \left( \frac{I_p * N_p}{N_s} \right) \quad (1)$$

$$Vout_{on} = (R_{sense}^{-1} + R_{detect}^{-1})^{-1} * \left( \frac{I_p * N_p}{N_s} \right) \quad (2)$$

where $R_{detect}$ is the resistance of the resistive path 122, $R_{sense}$ is the resistance of the burden resistor unit 120, $I_p$ is the current delivered to the load via the current coils 140, 142, $N_p$ is the number of turns in the primary winding (i.e. the current coils 140, 142), and $N_s$ is the number of turns of the secondary winding 134 of the CT 118.

Dividing equation 1 by equation 2, the ratio of $Vout_{off}$ to $Vout_{on}$ reduces to the equation 3 below, whereby the ratio of $Vout_{off}$ to $Vout_{on}$ is a known quantity regardless of any non-zero primary current.

$$\frac{Vout_{off}}{Vout_{on}} = 1 + \frac{R_{sense}}{R_{detect}} \quad (3)$$

Because the values of $R_{sense}$ (resistor 120) and $R_{detect}$ (resistor 146 and the inherent resistance of switch 144, if applicable) are known from the design specifications of the meter 100, the value of ($Vout_{off}/Vout_{on}$) will be a known quantity.

Figure 3:
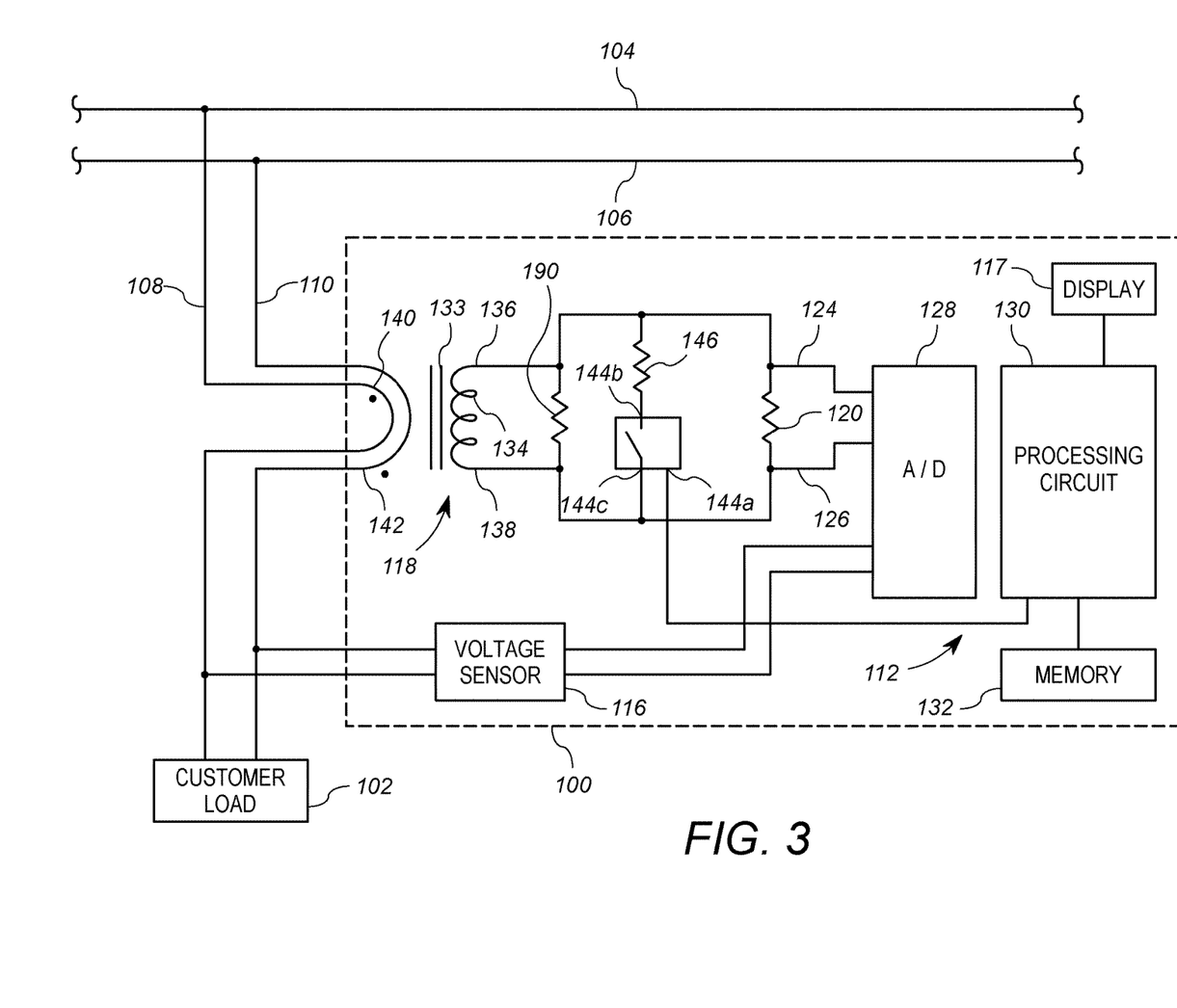
FIG. 3 shows a schematic diagram of the meter of FIG. 2 that has been subject to tampering.

In the case of a tampered meter where a resistance has been added across the terminals 136, 138 of the CT 118, the value of ($Vout_{off}/Vout_{on}$) changes. For example, FIG. 3 shows the meter 100 of FIG. 2 with such a resistor 190 having a resistance $R_{tamper}$ that has been added to tamper with the meter 100. With reference to FIG. 3, the simplified transfer function ratio changes from the known format of equation 3 to that of equation 4, below The ratio of the transfer function of equation 4 deviates from the known value set by the resistors 120, 146 (and any inherent resistance of the switch 144) from the controlled bill of materials.

$$\frac{Vout_{off}}{Vout_{on}} = 1 + \left( \frac{R_{detect}}{R_{sense}} + \frac{R_{detect}}{R_{tamper}} \right)^{-1} \quad (4)$$

Thus, any non-zero value for $R_{tamper}$ yields a different value in equation 4 than the expected value from equation 3. Accordingly, the digital processing circuit 128 is configured to determine such a tamper-induced error by first obtaining values representative of the magnitudes of $Vout_{off}$ over $Vout_{on}$, and then comparing a ratio of the magnitudes to the known value of $1+(R_{sense}/R_{detect})$. If the value of ($Vout_{off}/Vout_{on}$) varies from the expected value by more than a predetermined amount, then an error is detected. The digital processing circuit 130 is configured to store an indication (and preferably a date and time stamp) of the detection event. In some cases, the digital processing circuit 130 may cause the meter display 117 to display an indication of the detected error, and/or cause communication of an indication of the detected error to a remote device via an optional communication circuit, not shown. In this embodiment, the digital processing circuit 130 is also configured to control the state of the switch 144.

The disclosed embodiment can thus provide a definitive answer (as opposed to prior art methods) as to whether this type of tamper event is occurring.

In operation, the meter 100 both measures energy consumption on an ongoing basis, and performs a tamper detection operation on a periodic basis. It will be appreciated that the meter 100 may suitably perform several other conventional operations, not discussed herein, but which would be known to those skilled in the art.

To perform metering operations, the voltage sensor 116 senses the voltage provided to the load 102 on the lines 108, 110, and generates an analog voltage measurement signal representative of the voltage waveform. Similarly, typically with the switch 144 open, the current transformer 118 senses the line current provided to the load 102 via the current coils 140, 142 and generates an analog measurement current $I_s$ representative of the line current. The analog measurement current $I_s$ generates a voltage drop over the burden resistor unit 120 between the output terminals 124 and 126. The resulting analog voltage signal Vout is representative of the line current provided to the load 102, and constitutes the analog current measurement signal.

The ADC unit 128 samples each of the analog voltage measurement signal and the analog current measurement signal to generate corresponding digital voltage and current measurement signals. The digital voltage measurement signal constitutes a sequence of sample values that form a digital waveform representative of the voltage waveform on the lines 108, 110. The digital current measurement signal constitutes a sequence of sample values that form a digital waveform representative of the current waveform on the lines 108, 110. The digital processing circuit 130 receives the digital measurement signals and performs operations to generate metering quantities, such as kw-hr, VAR-hr, $I_{RMS}$, $V_{RMS}$ and the like. The digital processing circuit 130 may suitably display some or all of the values on the display 117, store the values in the memory 132, and/or communicate them externally using a communication circuit, not shown.

Figure 4:
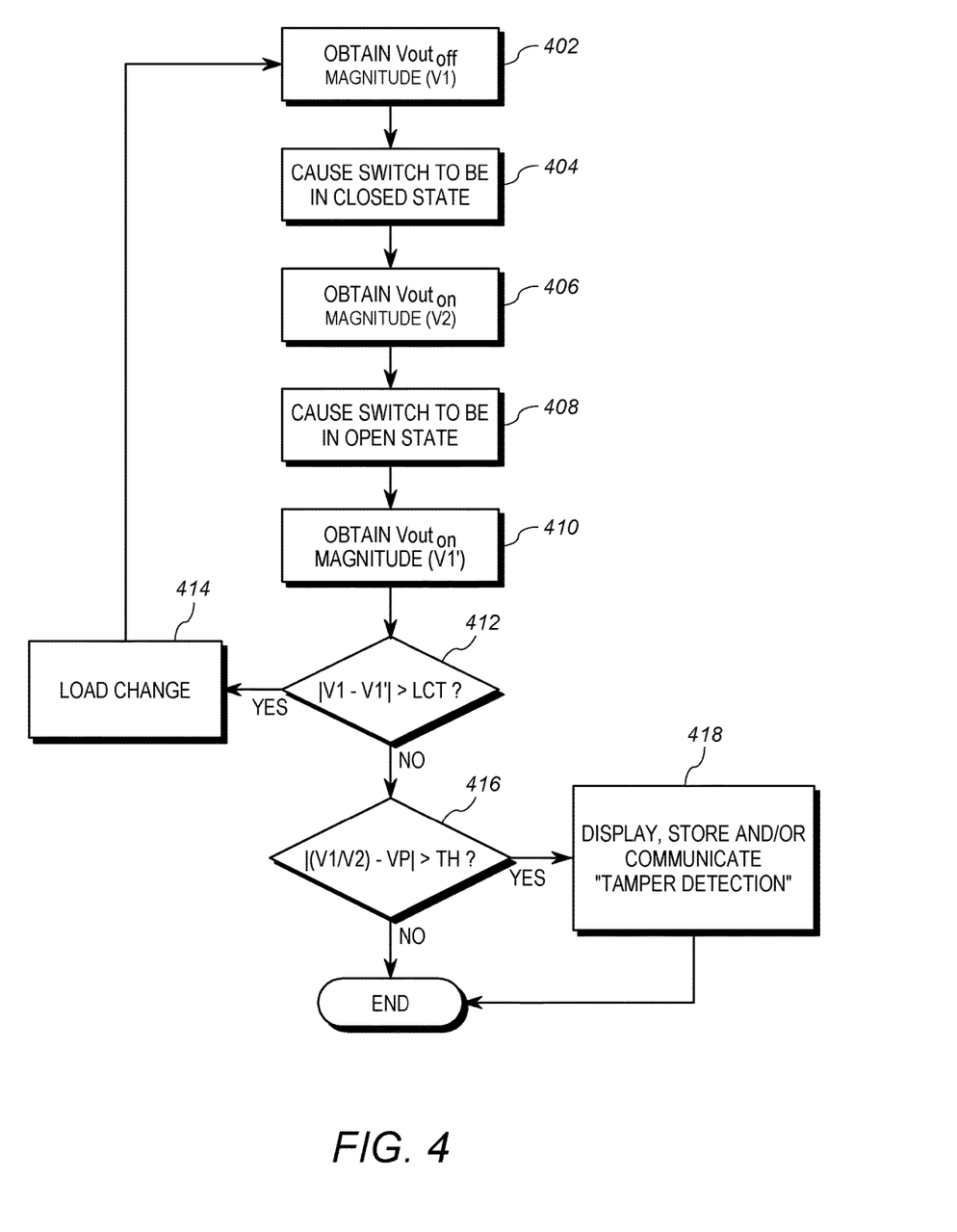
FIG. 4 shows a flow diagram of an exemplary set of operations that may be carried out by the processing circuit of the meter of FIG. 2 to detect tampering of the type illustrated in FIG. 3.

From time to time, the digital processing circuit 130 will perform a tamper detection process. By way of example, the process may be performed once a day, once an hour, or at some other interval. FIG. 4 shows the operations of the digital processing circuit 130 to carry out the tamper detection process. It will be appreciated that the digital processing circuit 130 continues to generate metering values (in another process) based on the digital current and voltage measurement signals while contemporaneously performing the operations of FIG. 4.

In step 402, the DPC 130 obtains a first value V1 representative of the magnitude of the voltage signal $\text{Vout}_{off}$ across the burden resistor unit 120 (e.g. across terminals 124, 126). To this end, the DPC 130 may obtain the maximum and minimum values of $\text{Vout}_{off}$ for a few cycles, for example, to develop a peak-to-peak voltage value to as V1, based on the difference between the maximum and minimum values. Alternatively, the DPC may generate an RMS value for $\text{Vout}_{off}$ to use as the value V1.

In step 404, the digital processing circuit (DPC) 130 provides a signal to the control terminal 144a to cause the switch 144 to change to the closed or conducting state, thereby operably connecting the resistive path 122 across the output terminals 124, 126 in parallel with the burden resistor unit 120. If the embodiment of FIG. 5 is employed as the switching element, the signal should have a voltage that exceeds the maximum voltage on the second terminal 138 of the CT 118.

In step 406, the DPC 130 obtains a second value V2 representative of the magnitude of the voltage signal $\text{Vout}_{on}$ across the burden resistor unit 120 (e.g. across terminals 124, 126). As before, the DPC 130 may obtain the maximum and minimum values of $\text{Vout}_{on}$ for a few cycles, or generate an RMS value for $\text{Vout}_{on}$, to use as the value V2.

In step 408, the DPC 130 provides a signal to the control terminal 144a to cause the switch 144 to change to the open or non-conducting state, thereby operably disconnecting (or open-circuiting) the resistive path 122 across the output terminals 124, 126.

In step 410, the DPC 130 obtains another value V1' representative of the magnitude of the voltage signal $\text{Vout}_{off}$ across the burden resistor unit 120. The purpose of obtaining another voltage measurement when the switch is open is to ensure that a load change did not occur during the test event. In particular, if the customer load 102 increases or decreases consumption during the test, then the voltage could change across the burden resistor 120 for reasons unrelated to tampering.

Thus, in step 412, the DPC 130 determines whether a load current change has occurred during the test (e.g. between steps 402 and 408) by comparing V1 with V1'. If the difference between V1 an V1' exceeds a predetermined load change threshold LCT, then the PC 130 determines that a load change has occurred (step 414) and returns to step 402 to repeat the test. It will be appreciated that step 414 may not actually involve any operation other than returning to step 402. Referring again to step 412, if the DPC 130 determines that the difference between V1 and V1' does not exceed the threshold, then the DPC 130 continues onto step 416.

Thereafter, in step 416, the DPC 130 determines whether the ratio of V1/V2 differs from a predetermined value VP by more than a predetermined tamper threshold TH. It will be appreciated that in the following operations an equations, either V1 or V1' can be used. The predetermined value is set by:

$$VP = 1 + \frac{R_{sense}}{R_{detect}} \quad (5)$$

The predetermined threshold TH is a value that takes into account appropriate tolerances for the resistances $R_{sense}$, $R_{detect}$, and other minor variations. For example, the threshold may based on a value from 1% to 10% of $R_{sense}/R_{detect}$.

If the determination in step 416 indicates that the ratio of V1/V2 differs from a predetermined value VP by more than a predetermine threshold TH, then a tamper indication is stored, displayed and/or communicated externally in step 418. If, however, the determination in step 416 indicates that the ratio of V1/V2 does not differ from a predetermined value VP by more than a predetermine threshold TH, then no tamper indication is stored, communicated and/or displayed.

An exemplary scenario is described in reference to FIGS. 2, 3, 4 and 5. In this example, the resistance $R_{sense}$ of the burden resistor unit 120 is 1.2Ω, the resistance of the resistor 146 is 1.2Ω, and the tamper resistor 190 has a resistance of 10Ω. The MOSFETs 502, 504 have a collective "on" resistance of 0.06Ω. Thus, the resistance $R_{detect}$ is 0.06 Ω+1.2Ω or 1.26Ω.

According to equation 5, the predetermined value VP is $$VP = 1 + \frac{1.2}{1.26} \quad (5)$$

or VP=1.95.

In a first example, it is assumed that no tamper resistor is present. In other words, the following operations are performed on the non-tampered meter shown in FIG. 2. Assume that the current $I_s$ in the secondary winding 134 is 10.6 mA.

In step 402, the DPC 130 obtains the magnitude V1 of the voltage $\text{Vout}_{off}$ across the output terminals 124, 126. In this example, the value of V1 is 12.7 mV. To this end, the current $I_s$ in the secondary winding 134 is dropped over the resistance of $R_{sense}$. Thus, the voltage magnitude $V1 = I_{s\_magnitude} * R_{sense}$. Substituting in the values, V1=0.0106*1.2, or or 12.7 mV.

In step 404, the DPC 130 provides a high logic signal to the gate/control terminal 144a of the MOSFET switch 144. In step 406, the DPC 130 obtains the magnitude V2 of the voltage $\text{Vout}_{on}$ across the output terminals 124, 126. In this example, the value of V2 is 6.5 mV. To this end, the current $I_s$ in the secondary winding is now dropped over the parallel resistances of $R_{sense}$ and $R_{detect}$, which has an equivalent resistance $R_{eq1}$ of (1.2*1.26)/(1.2+1.26) or 0.61Ω. Thus, the voltage magnitude $V2 = i_{s\_magnitude} * R_{eq1}$. Substituting in the values, V2=0.0106*0.61, or or 6.5 mV.

Thereafter, in step 408, the DPC 130 causes the switch 144 to be nonconducting between the terminals 144b and 144c. This represents the normal operating mode. In step 410, the DPC 130 obtains the magnitude V1' of the voltage $\text{Vout}_{off}$ across the output terminals 124, 126. In this example, it is assume that the load has not changed, and the value of V1' is the same as V1 or 12.7 mV.

In step 412, the DPC 130 determines that V1 and V1' do not differ by more than the threshold LCT, and proceeds to step 416. In step 416, the DPC 130 determines whether V1/V2 differs from VP by more than a threshold. To this end the DPC 130 identifies whether the following is true:

$$\left|\frac{V1}{V2} - VP\right| > TH$$

Assuming for this example, that the threshold is 5% of $R_{sense}/R_{detect}$, or 0.047, the DPC 130 determines whether:

$$\left|\frac{12.7}{6.5} - 1.95\right| > 0.047$$

or $$|1.95 - 1.95| > 0.047$$

In step 416, because the DPC 130 has determined that the statement is not true, the DPC 130 does not detect a tamper situation, and therefore does not store, communicate or display a tamper indication as a result of the operations of FIG. 4. It will be appreciated, however, that other tamper detection mechanisms may also be employed that detect other types of tampering. The DPC 130 may display, store or communicate a tamper indication due to such other detection even if the determination in step 416 is in the negative. Nevertheless, the operations of FIG. 4 in this example do not identify any potential tampering.

In another exemplary execution of the operations of FIG. 4, all of the values are the same, except that a tamper resistor 190 of 10Ω has been connected across the terminals 136, 138 of the winding 134, as shown in FIG. 3.

In step 402, the DPC 130 obtains the magnitude V1 of the voltage Vout$_{off}$ across the output terminals 124, 126. The current I$_s$ in the secondary winding 134 is now dropped over the resistance of R$_{sense}$ in parallel with R$_{tamper}$. This resistance R$_{eq3}$ is 1.07Ω. Thus, the voltage magnitude V1=I$_s$*R$_{eq3}$. Substituting in the values, V1=0.0106*1.07, or or 11.4 mV. Thus, in this example, the value of V1 is 12.7 mV.

In step 404, the DPC 130 provides a high logic signal to the gate/control terminal 144a of the MOSFET switch 144. In step 406, the DPC 130 obtains the magnitude V2 of the voltage Vout$_{on}$ across the output terminals 124, 126. The current I$_s$ of the secondary winding 134 is now dropped over the parallel resistances of R$_{tamper}$, R$_{sense}$ and R$_{detect}$, which is the same as R$_{eq1}$ in parallel with R$_{tamper}$. This parallel resistance has an equivalent resistance R$_{eq2}$ of (0.61*10)/(0.61+10) or 0.575Ω. Thus, the voltage magnitude V2=I$_s$*R$_{eq2}$. Substituting in the values, V2=0.0106*0.575, or or 6.1 mV.

Thereafter, in step 408, the DPC 130 causes the switch 144 to be nonconducting between the terminals 144b an 144c. This represents again the normal operating mode. In step 410, the DPC 130 obtains another magnitude V1' of the voltage Vout$_{off}$ across the output terminals 124, 126. Assuming the load current has not changed, the current I$_s$ in the secondary winding 134 is again only dropped over the resistance of R$_{sense}$ in parallel with R$_{tamper}$. This resistance R$_{eq3}$ is 1.07Ω. Thus, the voltage magnitude V1'=I$_s$*R$_{eq3}$. Substituting in the values, V1'=0.0106*1.07, or or 11.4 mV.

In step 412, the DPC 130 determines that V1 and V1' do not differ by more than the threshold LCT, and proceeds to step 416. In step 416, the DPC 130 determines whether V1/V2 differs from VP by more than a threshold. To this end the DPC 130 identifies whether the following is true:

$$\left|\frac{V1}{V2} - VP\right| > TH$$

Assuming for this example, that the threshold is 5% of $R_{sense}/R_{detect}$, or 0.047, the DPC 130 determines whether:

$$\left|\frac{11.4}{6.1} - 1.95\right| > 0.047$$

or $$|1.87 - 1.95| > 0.047$$

In step 416, because the DPC 130 has determined that the statement is in this case true, the DPC 130 detects a tamper situation. The DPC 130 thereafter proceeds to step 418 to store, communicate and/or display the tamper indication as a result of the operations of FIG. 4.

Thus, the embodiment described herein can detect when tampering has occurred by placing a resistor in parallel with the current transformer of an electricity meter, or essentially, in parallel with a burden resistor of a current sensor of an electricity meter. It will be appreciated that the short time (one or a few cycles) that the switch 144 is conducting, the energy measurements performed by the current sensor 118 will be skewed due to the additional parallel resistance of the resistive path 122. This error is very small however, as the switch 144 need only be closed for one or a few cycles to obtain a "peak-to-peak" voltage reading. Moreover, the DPC 130 can be programmed to perform, during the time between steps 402 and 406, the ongoing energy calculations using approximations of the digital current waveform that are based on the digital current waveform immediately prior to starting at step 402. Other methods of reducing any error associated with the short time that the switch 144 is closed may be employed, if desired.

It will be appreciated that the the above-described embodiments are merely illustrative, and that those of ordinary skill in the art may readily devise their own modifications and implementations that incorporate the principles of the present invention and fall within the spirit and scope thereof.

What is claimed is:

1. A method of detecting an error in a meter having a current transformer, a resistive path and a burden resistor unit, the resistive path configured to be operably coupled and decoupled in parallel across the burden resistor unit, the method comprising:

obtaining in the a processing circuit a first value representative of a voltage magnitude across the burden resistor unit while said resistive path is operably decoupled across the burden resistor unit;

closing a switching element to operably couple said resistive path across the burden resistor unit;

obtaining in the processing circuit a second value representative of a voltage magnitude across the burden resistor unit while the switching element is closed;

opening the switching element to operably decouple said resistive path across the burden resistor unit;

obtaining in the processing circuit a third value representative of a voltage magnitude across the burden resistor unit while the switching element is open;

determining whether a load change has occurred based on the first value, the third value and a load change threshold; and when no load change has occurred, determining whether an error exists based on the first value, the second value, and at least one predetermined stored value.

2. The method of claim 1, wherein the resistive path includes a resistor having a predetermined resistance.

3. The method of claim 2, wherein the switching element includes at least a first field effect transistor.

4. The method of claim 3, wherein closing the switching element further comprises providing a first control signal to a control terminal of the first field effect transistor.

5. The method of claim 1, wherein obtaining in the processing circuit the first value further comprises determining a peak-to-peak voltage magnitude and employing the peak-to-peak voltage magnitude as the first value.

6. The method of claim 1, wherein obtaining in the processing circuit the first value further comprises determining an RMS voltage magnitude and employing the RMS voltage magnitude as the first value.

7. The method of claim 1, wherein the at least one predetermined stored value includes a first predetermined stored value and determining whether an error exists further comprises comparing a ratio of the first value to the second value to the first predetermined stored value.

8. The method of claim 7, wherein the first predetermined stored value is substantially equal to the ratio of a resistance of the burden resistor unit to a resistance of the resistive path plus one.

9. The method of claim 7, wherein the at least one predetermined stored value includes a predetermined tamper threshold and determining whether the error exists further comprises comparing a difference between the ratio of the first value to the second value and the first predetermined stored value to the predetermined tamper threshold.

10. The method of claim 1, further comprising:
responsive to determining that the error exists, storing an indication of the determination in a memory.

11. An arrangement for use in a utility meter, comprising:
a current transformer having a winding including first and second terminals;
a burden resistor unit coupled across the first and second terminals;
a resistive path having a first resistance coupled in parallel across the burden resistor unit;
a switching element operably coupled to controllably and alternatively connected and disconnect the resistive path across the first and second terminals;
a processing circuit configured to,
obtain a first value representative of a voltage magnitude across the burden resistor unit when the resistive path is disconnected across the first and second terminals;
obtain a second value representative of a voltage magnitude across the burden resistor unit when the resistive path is connected across the first and second terminals;
obtain a third value representative of a voltage magnitude across the burden resistor unit when the resistive path is disconnected across the first and second terminals;
determine whether a load change has occurred based on the first value, the third value, and a load change threshold; and,
when there has been no load change, determine whether an error exists based on the first value, the second value, and at least one predetermined stored value.

12. The arrangement of claim 11, wherein the processing circuit is further configured to generate at least one signal to control the switching element.

13. The arrangement of claim 12 wherein:
the switching element comprises first and second MOSFETS, each having a gate, drain and source;
the gates of the first and second MOSFETS are operably coupled to receive the at least one signal; and
the source of the first MOSFET is coupled to the source of the second MOSFET.

14. The arrangement of claim 13, further comprising a resistor series-connected with the drains and sources of the first and second MOSFETS in the resistive path, and wherein a resistance of each of the first and second MOSFETS forms a part of the first resistance.

15. The arrangement of claim 11, wherein the processing circuit is configured to determine a peak-to-peak voltage magnitude and employ the peak-to-peak voltage magnitude as the first value.

16. The arrangement of claim 11, wherein the processing circuit is configured to determine an RMS voltage magnitude and employ the RMS voltage magnitude as the first value.

17. The arrangement of claim 11, further comprising a memory storing the at least one predetermined value, wherein the at least one predetermined value includes a first predetermined value and the processing circuit is configured to compare a ratio of the first value to the second value to the first predetermined value.

18. The arrangement of claim 17, wherein the first predetermined value is substantially equal to the ratio of a resistance of the burden resistor unit to the first resistance of the resistive path plus one.

19. The arrangement of claim 11, wherein the burden resistor unit include a first resistor having a resistance of the burden resistor unit.

* * * * *